United States Patent
Lenz

(10) Patent No.: US 9,951,423 B2
(45) Date of Patent: Apr. 24, 2018

(54) SYSTEMS AND METHODS FOR MEASURING ENTRAINED VAPOR

(71) Applicant: Lam Research Corporation, Fremont, CA (US)

(72) Inventor: Eric H. Lenz, Livermore, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 28 days.

(21) Appl. No.: 14/872,239

(22) Filed: Oct. 1, 2015

(65) Prior Publication Data

US 2016/0097127 A1 Apr. 7, 2016

Related U.S. Application Data

(60) Provisional application No. 62/060,718, filed on Oct. 7, 2014.

(51) Int. Cl.
| | |
|---|---|
| *C23C 16/52* | (2006.01) |
| *C23C 16/455* | (2006.01) |
| *G05D 7/06* | (2006.01) |
| *C23C 16/448* | (2006.01) |

(52) U.S. Cl.
CPC ........ *C23C 16/52* (2013.01); *C23C 16/4481* (2013.01); *C23C 16/45561* (2013.01); *G05D 7/0658* (2013.01)

(58) Field of Classification Search
CPC .............. C23C 16/52; C23C 16/4481; C23C 16/45561; G05D 7/0658
USPC .......................... 137/89, 110; 118/715, 663
See application file for complete search history.

(56) References Cited

U.S. PATENT DOCUMENTS

| | | | | |
|---|---|---|---|---|
| 4,911,101 A | * | 3/1990 | Ballingall, III | ..... C23C 16/4482 118/708 |
| 8,601,976 B2 | * | 12/2013 | Nishino | ................ C23C 16/455 118/663 |
| 9,494,947 B2 | * | 11/2016 | Hirata | ................. G01F 25/0007 |
| 2012/0272898 A1 | | 11/2012 | Ye et al. | |
| 2014/0124064 A1 | * | 5/2014 | Hidaka | ............... C23C 16/4481 137/511 |
| 2014/0230911 A1 | | 8/2014 | Hirata et al. | |

(Continued)

FOREIGN PATENT DOCUMENTS

CN 103518005 A 1/2014

OTHER PUBLICATIONS

First Office Action for Chinese Application No. 201510646121.8 dated Aug. 1, 2017; 20 pages.

*Primary Examiner* — Ian Paquette

(57) ABSTRACT

A system for supplying precursor gas to a substrate processing chamber includes a first mass flow controller including an inlet to receive a carrier gas and an outlet. An ampoule is configured to supply a precursor gas. A valve system, in fluid communication with the first mass flow controller and the ampoule, is configured to supply the precursor gas and the carrier gas to a momentum-based flow restriction member. A pressure sensing system is configured to sense an inlet pressure at an inlet of the momentum-based flow restriction member and an outlet pressure at an outlet of the momentum-based flow restriction member. A controller is configured to determine a flow rate of the precursor gas at the outlet of the momentum-based flow restriction member based on a difference between the inlet pressure and the outlet pressure.

23 Claims, 6 Drawing Sheets

(56) References Cited

U.S. PATENT DOCUMENTS

2016/0097126 A1* 4/2016 Kogura ............ H01L 21/02126
438/778

* cited by examiner

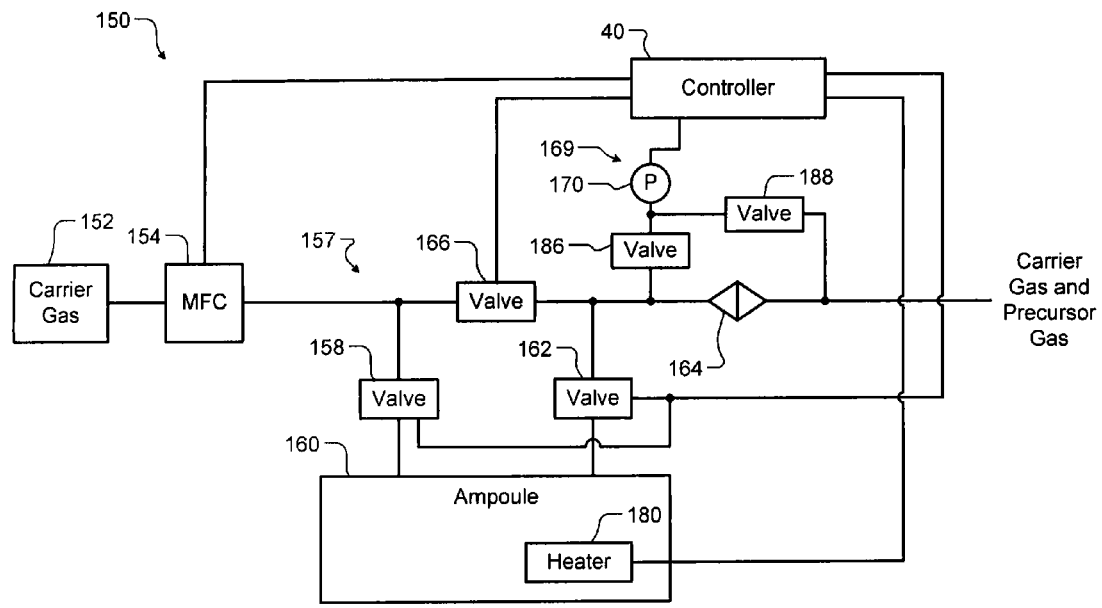

SYSTEMS AND METHODS FOR MEASURING ENTRAINED VAPOR

CROSS-REFERENCE TO RELATED APPLICATIONS

This application claims the benefit of U.S. Provisional Application No. 62/060,718, filed on Oct. 7, 2014. The entire disclosure of the application referenced above is incorporated herein by reference.

FIELD

The present disclosure relates to substrate processing systems and more particularly to systems and methods for measuring entrained vapor in a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform ashing, deposition and/or etching of film on a substrate. Substrate processing systems typically include a processing chamber with a substrate support such as a pedestal, an electrostatic chuck, a plate, etc. A substrate such as a semiconductor wafer may be arranged on the substrate support. In chemical vapor deposition (CVD) processes, a gas mixture including one or more precursors may be introduced into the processing chamber to deposit a film on the substrate. In some substrate processing systems, plasma may be used to activate chemical reactions.

To obtain high quality film, it is important to deliver the precursor gas to the processing chamber with a desired concentration. The precursor may be a solid that is sublimated or liquid that is evaporated into carrier gas to provide the precursor gas. In some substrate processing systems, precursor flow may be measured using a mass flow sensor. However, mass flow sensors typically have issues with high temperature, low pressure, and/or low pressure drops that may be used. Other ways of measuring gas concentration include infrared sensors (IR), Fourier Transform Infrared (FTIR) spectrometers, and ion mass spectrometers. However, these approaches typically have high cost or do not generate a signal characterizing the concentration of the precursor gas.

SUMMARY

A system for supplying precursor gas to a substrate processing chamber includes a first mass flow controller including an inlet to receive a carrier gas and an outlet. An ampoule is configured to supply a precursor gas. A momentum-based flow restriction member includes an inlet and an outlet. A valve system, in fluid communication with the first mass flow controller and the ampoule, is configured to supply the precursor gas and the carrier gas to the momentum-based flow restriction member. A pressure sensing system is configured to sense an inlet pressure at the inlet of the momentum-based flow restriction member and an outlet pressure at the outlet of the momentum-based flow restriction member. A controller is configured to determine a flow rate of the precursor gas at the outlet of the momentum-based flow restriction member based on a difference between the inlet pressure and the outlet pressure.

In other features, the controller is configured to adjust a flow rate of the carrier gas supplied by the first mass flow controller, based on a predetermined relationship between the flow rate of the precursor gas and the pressure difference, to control the flow rate of the precursor gas at the outlet of the momentum-based flow restriction member.

In other features, a heater heats the ampoule. The controller selectively adjusts the heater to control a flow rate of the precursor gas at the outlet of the momentum-based flow restriction member. The momentum-based flow restriction member includes a restricted orifice.

In other features, the valve system includes a first valve selectively connecting the outlet of the first mass flow controller to the inlet of the ampoule, a second valve selectively connecting the outlet of the first mass flow controller to the inlet of the momentum-based flow restriction member, and a third valve selectively connecting the outlet of the ampoule to the inlet of the momentum-based flow restriction member.

In other features, the pressure sensing system includes a first pressure sensor in communication with the inlet of the momentum-based flow restriction member. A second sensor communicates with the outlet of the momentum-based flow restriction member.

In other features, the pressure sensing system includes a pressure sensor, a first valve for selectively connecting the pressure sensor to the inlet of the momentum-based flow restriction member, and a second valve for selectively connecting the pressure sensor to the outlet of the momentum-based flow restriction member.

In other features, the carrier gas has a first density and the precursor gas has a second density. The second density is greater than 9 times the first density. The carrier gas includes argon and the precursor gas is selected from a group consisting of tungsten pentachloride and tungsten hexachloride.

In other features, a second mass flow controller includes an inlet in communication with the inlet of the first mass flow controller and an outlet in communication with the outlet of the momentum-based flow restriction member. The controller is configured to adjust the flow rate of the precursor gas to the substrate processing chamber by controlling the flow rate of the carrier gas to the first mass flow controller and to vary the flow rate of the carrier gas supplied by the second mass flow controller to the substrate processing chamber in response to changes in the flow rate of the carrier gas to the first mass flow controller.

A method for supplying precursor gas to a substrate processing chamber includes supplying a carrier gas using a first mass flow controller; supplying a precursor gas using an ampoule; supplying the precursor gas and the carrier gas to a momentum-based flow restriction member including an inlet and an outlet; sensing an inlet pressure at the inlet of the momentum-based flow restriction member and an outlet pressure at the outlet of the momentum-based flow restriction member; and determining a flow rate of the precursor gas to the substrate processing chamber based on a pressure difference between the inlet pressure and the outlet pressure and a predetermined relationship between the pressure difference and the flow rate of the precursor gas.

In other features, the method includes adjusting a flow rate of the carrier gas supplied by the first mass flow controller, based on the determined flow rate of the precursor gas, to control the flow rate of the precursor gas at the outlet of the momentum-based flow restriction member.

In other features, the method includes adjusting a temperature of the ampoule, based on the calculated flow rate of the precursor gas, to control the flow rate of the precursor gas at the outlet of the momentum-based flow restriction member.

In other features, the restricted orifice includes a momentum-based flow restriction member.

In other features, supplying the precursor gas and the carrier gas includes using a first valve selectively connecting the outlet of the first mass flow controller to the ampoule; using a second valve selectively connecting the outlet of the first mass flow controller to the momentum-based flow restriction member; and using a third valve selectively connecting the ampoule to the momentum-based flow restriction member.

In other features, sensing the inlet pressure and the outlet pressure includes arranging a first pressure sensor in communication with the inlet of the momentum-based flow restriction member; and arranging a second sensor in communication with the outlet of the momentum-based flow restriction member.

In other features, sensing the inlet pressure and the outlet pressure includes selectively connecting a pressure sensor to the inlet of the momentum-based flow restriction member and sensing the inlet pressure; and selectively connecting the pressure sensor to the outlet of the momentum-based flow restriction member and sensing the outlet pressure.

In other features, the carrier gas has a first density and the precursor gas has a second density. The second density is greater than 9 times the first density. The carrier gas includes argon and the precursor gas is selected from a group consisting of tungsten pentachloride and tungsten hexachloride.

In other features, the method includes arranging an inlet of a second mass flow controller in communication with an inlet of the first mass flow controller and an outlet of the second mass flow controller in communication with an outlet of the momentum-based flow restriction member; varying the flow rate of the precursor gas to the substrate processing chamber by adjusting the flow rate of the first mass flow controller; and varying the flow rate of the carrier gas supplied by the second mass flow controller to the substrate processing chamber in response to changes to the flow rate of the first mass flow controller.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 3A-3C are functional block diagrams of examples of a precursor gas delivery system according to the present disclosure;

In the drawings, reference numbers may be reused to identify similar and/or identical elements.

DETAILED DESCRIPTION

The present disclosure describes systems and methods for measuring entrained vapor in a substrate processing system. The systems and methods for measuring entrained vapor use a mass flow controller to control flow of a carrier gas. The carrier gas flows through an ampoule containing precursor material and then through a momentum-based flow restriction member. In some examples, the momentum-based flow restriction member includes a restricted orifice. The precursor may be a solid that is sublimated or liquid that is evaporated into the carrier gas using a low pressure drop and high temperature. The systems and methods measure the pressure drop across the momentum-based flow restriction member. The pressure drop is used to determine the amount of precursor gas that is added to the carrier gas.

Figure 1:
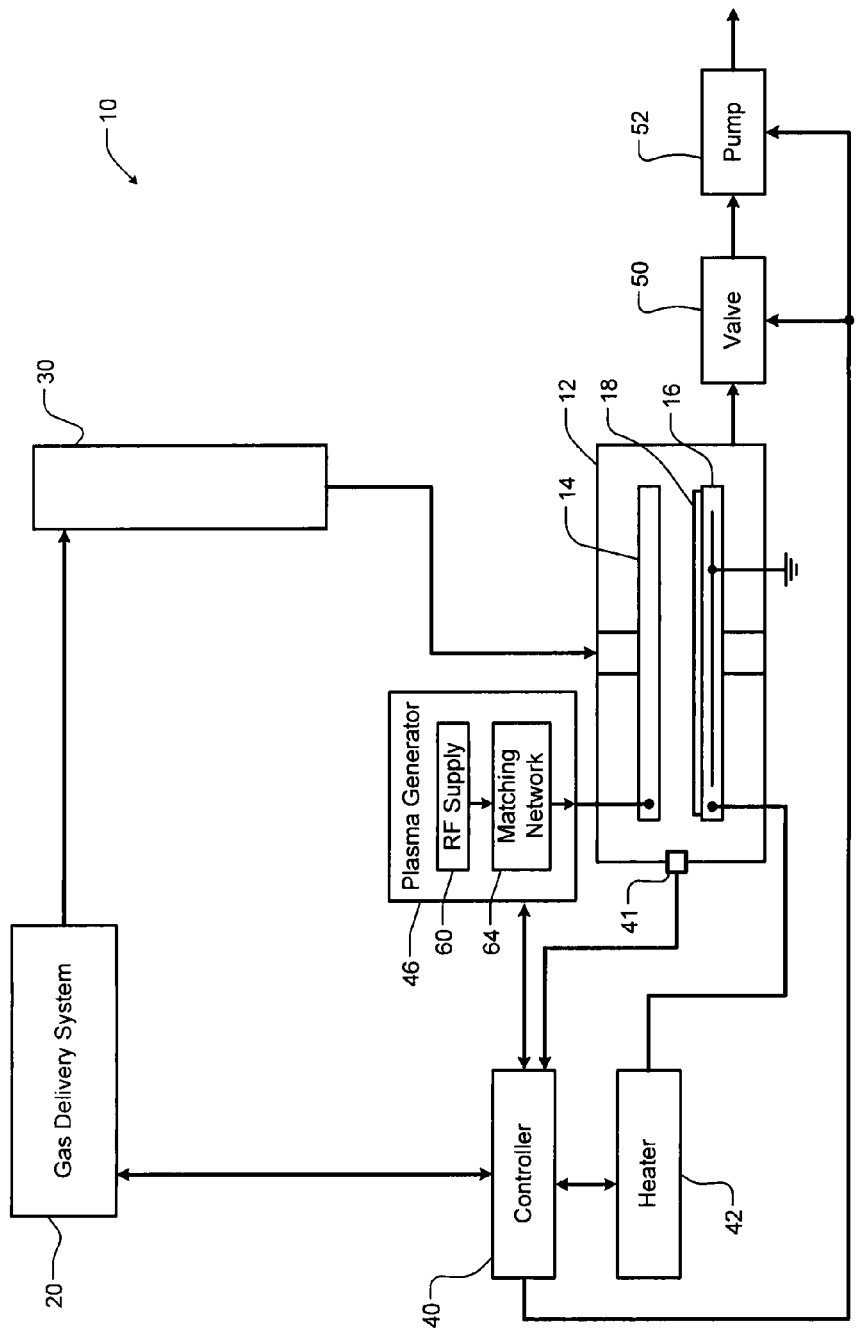
FIG. 1 is a functional block diagram of an example of a substrate processing system according to the present disclosure.

Referring now to FIG. 1, an example of a substrate processing system 10 is shown. While an example of a plasma-enhanced (PE) chemical vapor deposition (CVD) tool will be shown for discussion purposes, the present disclosure applies to other processes such as CVD, atomic layer deposition (ALD), PEALD, etc. requiring delivery of precursor gas. The substrate processing systems may operate with or without plasma. The substrate processing system 10 includes a processing chamber 12. Gas may be supplied to the processing chamber 12 using a gas distribution device 14. In some examples, the gas distribution device 14 may include a showerhead including a plurality of holes that face the substrate or other device. A substrate 18 such as a semiconductor wafer may be arranged on a substrate support 16 during processing. The substrate support 16 may include a pedestal, an electrostatic chuck, a mechanical chuck or other type of substrate support.

A gas delivery system 20 may supply one or more gases to a manifold 30, which supplies the gas mixture to the processing chamber 12. Alternately, gas can be supplied directly to the processing chamber 12. A controller 40 may be used to monitor process parameters such as temperature, pressure etc. (using sensors 41) and to control process timing. The controller 40 may be used to control process devices such as the gas delivery system 20, a pedestal heater 42, and/or a plasma generator 46. The controller 40 may also be used to evacuate the processing chamber 12 using a valve 50 and pump 52. The controller 40 may also be used to control a precursor gas delivery system shown in FIGS. 3A-3C, 5 and 6.

The plasma generator 46 generates the plasma in the processing chamber. The plasma generator 46 may be an inductive or capacitive-type plasma generator. In some examples, the plasma generator 46 may include an RF power supply 60 and a matching and distribution network 64. While the plasma generator 46 is shown connected to the gas distribution device 14 with the pedestal grounded or floating, the plasma generator 46 can be connected to the substrate support 16 and the gas distribution device 14 can be grounded or floating. While plasma is shown being generated in the processing chamber, plasma may be generated remotely. While RF plasma is shown, microwave plasma may be used.

Figure 2:
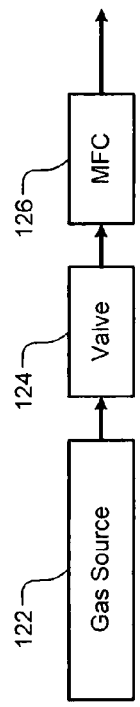
FIG. 2 is a functional block diagram of an example of a portion of a gas delivery system according to the present disclosure.

Referring now to FIG. 2, the gas delivery system 20 may supply gas from one or more gas sources 122 using one or more valves 124 and one or more mass flow controllers 126. Alternately, other flow control devices may be used to controllably supply precursor gases, reactive gases, inert gases, purge gases, and mixtures thereof to a manifold 30, which supplies the gas mixture to the processing chamber 12.

Figure 3A:
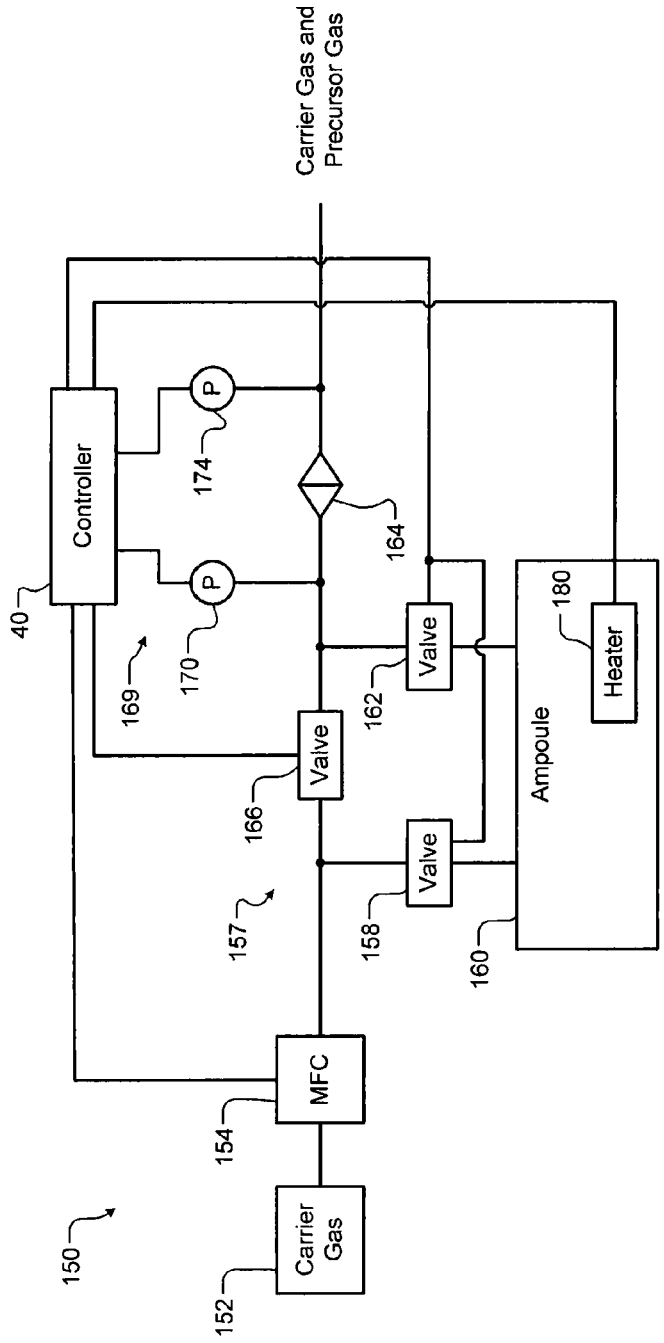

Referring now to FIG. 3A, the gas delivery system 20 may further include a precursor delivery system 150 to deliver one or more precursors via the manifold 30 and/or directly to the processing chamber 12. The precursor delivery system 150 includes a carrier gas source 152 that supplies carrier gas to a mass flow controller (MFC) 154.

A valve system 157 supplies either carrier gas or carrier gas and precursor gas. In some examples, the valve system 157 includes a first valve 158 that selectively connects an outlet of the MFC 154 to an inlet of an ampoule 160. Liquid or solid precursor is located in the ampoule 160. A valve 162 selectively connects an outlet of the ampoule 160 to an inlet of a momentum-based flow restriction member 164. A valve 166 selectively connects the mass flow controller 154 to the inlet of the momentum-based flow restriction member 164.

A pressure sensing system 169 measures pressure at the inlet and outlet of the momentum-based flow restriction member 164. In some examples, the pressure sensing system 169 includes a first pressure sensor 170 that senses pressure at an inlet of the momentum-based flow restriction member 164 and a second pressure sensor 174 that senses pressure at an outlet of the momentum-based flow restriction member 164. A heater 180 may be provided to heat the precursor in the ampoule 160.

Referring now to FIGS. 3B and 3C, examples of other ways for measuring the pressure are shown. For example in FIG. 3B, the pressure sensor 170 can be selectively connected to the inlet or the outlet of the momentum-based flow restriction member 164 (or neither) by valves 186 and 188. This approach reduces the number of components that are required. In FIG. 3C, valves 190 and 192 can selectively connect, disconnect or purge lines to the pressure sensor(s). A similar approach can be used for the system in FIG. 3B.

Figure 4:
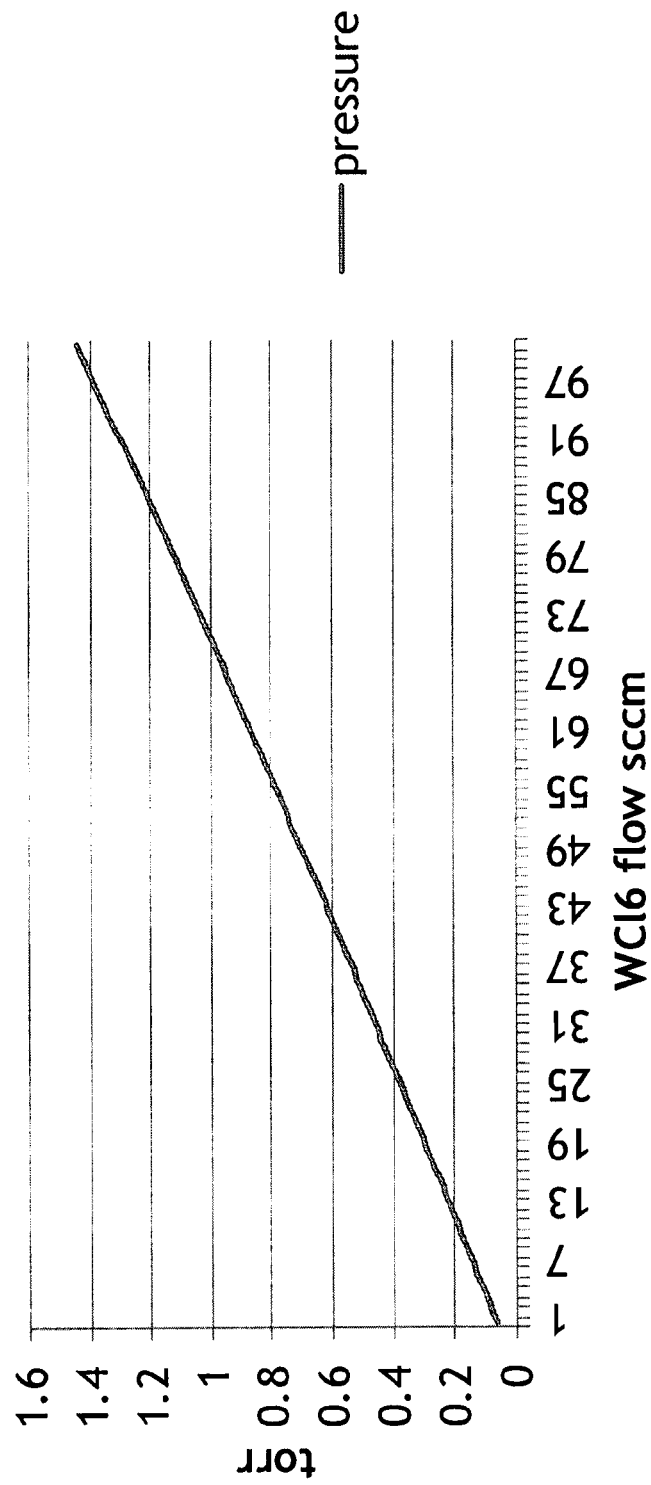
FIG. 4 is a graph of an example of a relationship between pressure drop and precursor flow.

Referring now to FIG. 4, a graph showing a predicted pressure difference between the pressure sensors at a processing chamber operating pressure of 60 Torr and using 0.1 inch orifice is shown. The graph demonstrates a relationship between pressure drop and precursor flow. The pressure drop changes with relatively small changes in precursor flow.

In some examples, the systems and methods for measuring entrained vapor employ two pressure sensors and a momentum-based flow restriction member to allow high temperature usage. In some examples, using a carrier gas with a much lower mass value than the precursor gas allows a low pressure drop with high resolution with respect to the precursor. The controller 40 determines the pressure drop based on outputs of the pressure sensors 170 and 174 and a stored relationship such as the one shown in FIG. 4.

In some examples, operating pressures in the ampoule are from about 10 torr to 100 torr, although other pressures may be used. In some examples, processing chamber pressure is between 5 torr and 60 torr, although other pressures may be used. Orifice sizes typically depend on how much precursor and carrier gas we will be needed and pressures that are used in the ampoule and the processing chamber. In some examples, the momentum-based flow restriction member includes a restricted orifice between 0.050" to 0.020", although other sizes may be used.

In some examples, $WCl_5$ or $WCl_6$ is used as the precursor gas and the temperature of the ampoule will vary between 135° C. to 190° C., although other precursor gas and ampoule temperatures may be used. In some examples, the temperature of the ampoule is varied to make up for the varying output of the ampoule due to changes in material remaining in the ampoule. In some examples, the temperature of the ampoule is varied about 10° C. between full and partially empty (which amounts to about a 100% change in output on a newly filled ampoule) to maintain flow.

The momentum-based flow restriction member can be sized such that the pressure drop is low for the carrier gas, but small enough to pick up the precursor gas flow. For example, by using molecular hydrogen as the carrier gas, 1000 sccm of molecular hydrogen with 5 sccm of tungsten hexachloride ($WCl_6$) will have twice the pressure drop of 1000 sccm of molecular hydrogen alone, although other temperature differences may be used.

In one example, the amount of sublimated $WCl_6$ in the carrier gas is determined without a substantial pressure drop at 200° C. Since $WCl_6$ has 396 atomic mass units (amu), a small amount of $WCl_6$ will increase the density of the carrier gas such that the pressure drop at the momentum-based flow restriction member increases significantly enough to calculate the amount of $WCl_6$. With argon as a carrier gas, there is about 10 times difference in mass with $WCl_6$. However, using molecular hydrogen as the carrier gas and $WCl_6$ as the precursor, there is a 200 times difference in mass. When using tungsten pentachloride ($WCl_5$), which has amu of 360 instead of 396, there is about 9 to 1 density difference when using argon as the carrier gas. However, the arrangement still works using higher ampoule pressures.

When molecular hydrogen is used as the carrier gas, a fairly small momentum-based flow restriction member can be used. When the $WCl_6$ mixture is added, a relatively high pressure drop will occur due to the low pressure drop of the molecular hydrogen gas. High temperature operation, that is typically a problem for most of the other sensing technologies, is not a problem for the momentum-based flow restrictor.

Laminar pressure drop ($P_{drop\_l}$) varies with viscosity v and flow rate μ. In other words $P_{drop\_l} \approx \mu v = vM^{0.5}$ (since $\mu = M^{0.5}$), where M is mass. Momentum pressure drop ($P_{drop\_m}$) varies with the flow rate squared $v^2$ and the mass M. In other words, $P_{drop\_m} \approx Mv^2$.

In one example, neglecting the effect of molecular size and the Sutherland constant, at 1000 sccm of molecular hydrogen, adding 100 sccm of WCl6 changes the pressure drop for laminar flow to $((1000*2+100*396)/1100/2)^{0.5}*(1100/1000)$, which corresponds to 4.7 higher pressure drop than molecular hydrogen alone. For a momentum-based pressure drop such as a restricted orifice, the pressure drop corresponds to $(1000*2+100*396)/1100/2*(1100/1000)^2$, which is 22.9 times the pressure drop of molecular hydrogen alone.

At 1000 sccm of Ar, again neglecting the effect of molecular size and the Sutherland constant, adding 100 sccm of $WCl_6$ changes laminar flow to $((1000*40+100*396)/1100/40)^{0.5}*(11100/1000)$, which corresponds to 1.47 higher pressure drop than Ar alone. For a momentum-based pressure drop such as a restricted orifice, the pressure drop corresponds to $(1000*40+100*396)/1100/40*(1100/1000)^2$, which corresponds to 2.19 higher pressure drop than Ar alone.

Therefore, using $WCl_6$ as the precursor, a momentum-based pressure drop such as restricted orifice and molecular hydrogen as the carrier gas, there is a relatively high change in the pressure drop with changes in flow. The size of the momentum-based flow restriction member can be selected to provide sufficient accuracy.

Using a carrier gas with a lower mass number than the process gas improves the pressure resolution when a small restriction is used. Calibrating with the carrier gas improves the pressure measurement at the actual pressure values to be measured, makes up for manometer drift, and improves the accuracy of the flow measurement.

Using a flow restriction member that is momentum based (such as a restricted orifice) improves the pressure drop difference between the carrier gas and carrier gas with the precursor gas. The systems and methods described herein are able to operate at the rated temperature of the pressure sensors (with or without purging or valve arrangements shown in FIGS. 3A-3C). Cost is saved over other systems due to the lower cost of pressure sensing equipment.

The systems and methods described herein can be either passive systems that monitor precursor gas output or active systems that change carrier gas flow to compensate for precursor delivery changes. To vary the flow rate of precursor, the carrier gas flow can be varied by the MFC 154 and/or by varying the temperature of the ampoule 160 using the heater 180. Increasing the temperature of the ampoule 160 increases the rate that precursor is sublimated or evaporated.

Figure 5:
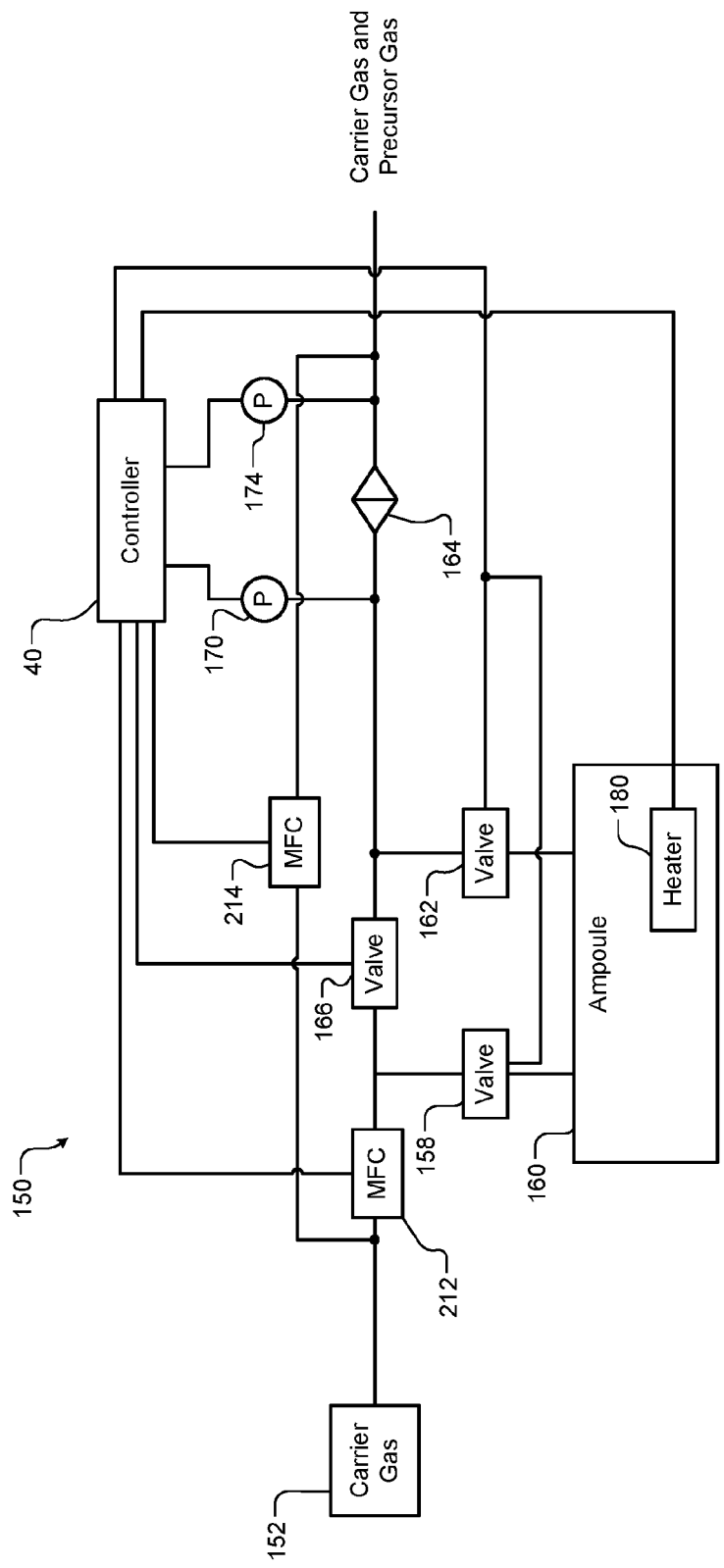
FIG. 5 is a functional block diagram of an example of a precursor gas delivery system according to the present disclosure.

Alternately in another example shown in FIG. 5, carrier gas flow through the ampoule 160 is varied with a MFC 212. A second MFC 214 provides make up flow of carrier gas so the total amount of flow of the carrier gas is the same. The pressure sensors 170 and 174 measure flow from the ampoule 160. The other carrier gas is added after the measurement.

In some examples, the carrier gas is selected to provide a large density difference with respect to the sublimated or evaporated precursor gas. In some examples, there is greater than 9 times or more difference in density between the carrier gas and the precursor gas. In other examples, there is greater than 25, 50, 100 or 200 times or more difference in density between the carrier gas and the precursor.

For example, since $WCl_6$ is a relatively dense precursor, argon can be used as the carrier gas while still providing a sufficient difference in density. A higher difference in density can be achieved with $WCl_6$ precursor by using molecular hydrogen as the carrier gas. However, for lighter precursors, helium or hydrogen may be used to provide a sufficient difference in density.

Figure 6:
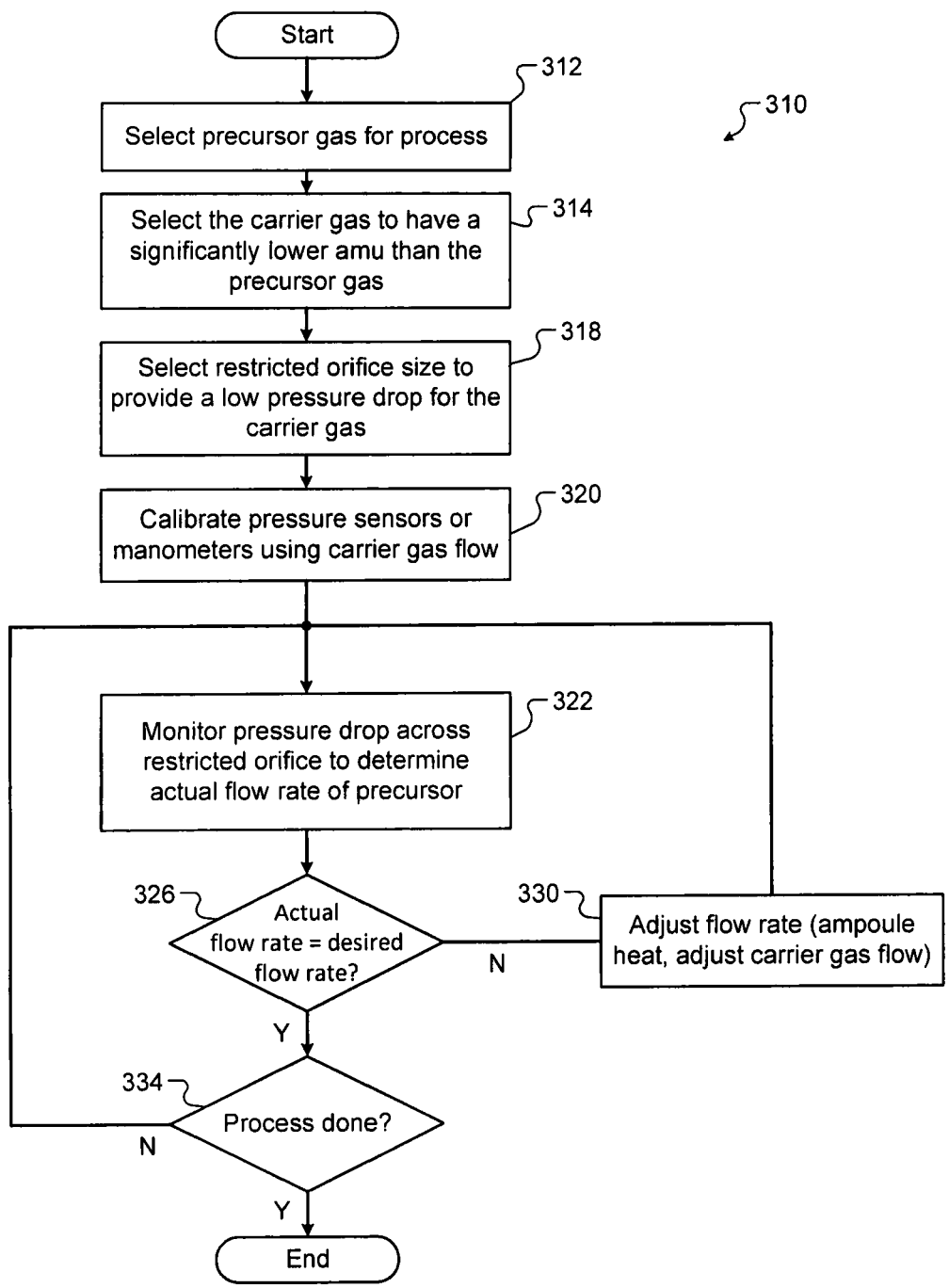
FIG. 6 is a flowchart illustrating steps of a method for measuring flow of entrained vapor according to the present disclosure.

Referring now to FIG. 6, a method 310 for controlling the flow of precursor to a process is shown. At 312, the precursor gas is selected for the process. At 314, the carrier gas is selected to have a significantly lower atomic mass unit than the precursor gas. At 318, the size of the momentum-based flow restriction member is selected to provide a low pressure drop for the carrier gas, but enough for measurement accuracy of the precursor. At 320, the manometers are calibrated with carrier gas flow. At 322, a controller monitors the pressure drop across the momentum-based flow restriction member during operation to determine the actual flow rate of the precursor. At 326, the actual flow rate is compared to a desired flow rate. If the actual flow rate does not equal the desired flow rate (such as within a predetermined range or window), the flow rate is adjusted at 330 using any suitable technique such as adjusting the heat of the ampoule or adjusting carrier gas flow as described herein. Control returns from 322. If the actual flow rate is equal to the desired flow rate at 326, control determines whether the process is done at 334. If false, control returns to 322. Otherwise control ends.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A system for supplying precursor gas to a substrate processing chamber, comprising:
   a first mass flow controller including an inlet to receive a carrier gas and an outlet;
   an ampoule configured to supply a precursor gas;
   a momentum-based flow restriction member including an inlet and an outlet;
   a valve system, in fluid communication with the first mass flow controller and the ampoule, configured to supply the precursor gas and the carrier gas to the momentum-based flow restriction member;
   a pressure sensing system configured to sense an inlet pressure at the inlet of the momentum-based flow restriction member and an outlet pressure at the outlet of the momentum-based flow restriction member; and
   a controller configured to, based on a pressure difference between the inlet pressure and the outlet pressure, determine a flow rate of the precursor gas at the outlet of the momentum-based flow restriction member while the momentum-based flow restriction member is receiving both the precursor gas and the carrier gas.

2. The system of claim 1, wherein the controller is configured to adjust a flow rate of the carrier gas supplied by the first mass flow controller, based on a predetermined relationship between the flow rate of the precursor gas and the pressure difference, to control the flow rate of the precursor gas at the outlet of the momentum-based flow restriction member.

3. The system of claim 1, further comprising a heater to heat the ampoule,
   wherein the controller selectively adjusts the heater to control a flow rate of the precursor gas at the outlet of the momentum-based flow restriction member.

4. The system of claim 1, wherein the momentum-based flow restriction member includes a restricted orifice.

5. The system of claim 1, wherein the valve system includes:
   a first valve selectively connecting the outlet of the first mass flow controller to the inlet of the ampoule;
   a second valve selectively connecting the outlet of the first mass flow controller to the inlet of the momentum-based flow restriction member; and
   a third valve selectively connecting the outlet of the ampoule to the inlet of the momentum-based flow restriction member.

6. The system of claim 1, wherein the pressure sensing system includes:
   a first pressure sensor in communication with the inlet of the momentum-based flow restriction member; and
   a second pressure sensor in communication with the outlet of the momentum-based flow restriction member.

7. The system of claim 1, wherein the pressure sensing system includes:
   a pressure sensor;
   a first valve for selectively connecting the pressure sensor to the inlet of the momentum-based flow restriction member; and
   a second valve for selectively connecting the pressure sensor to the outlet of the momentum-based flow restriction member.

8. The system of claim 1, wherein:
   the carrier gas has a first density;
   the precursor gas has a second density; and
   the second density is greater than 9 times the first density.

9. The system of claim 1, wherein the carrier gas includes argon and the precursor gas is selected from a group consisting of tungsten pentachloride and tungsten hexachloride.

10. The system of claim 1, further comprising a second mass flow controller including an inlet in communication with the inlet of the first mass flow controller and an outlet in communication with the outlet of the momentum-based flow restriction member,
    wherein the controller is configured to vary the flow rate of the carrier gas supplied by the second mass flow controller to the substrate processing chamber in response to changes in the flow rate of the carrier gas to the first mass flow controller.

11. The system of claim 1, wherein the controller is configured to adjust the flow rate of the precursor gas to the substrate processing chamber by controlling the flow rate of the carrier gas to the first mass flow controller.

12. The system of claim 11, wherein the controller is configured to adjust the flow rate of the precursor gas to the substrate processing chamber in response to changes in the flow rate of the carrier gas to the first mass flow controller.

13. A system for supplying precursor gas to a substrate processing chamber, comprising:
a first mass flow controller including an inlet to receive a carrier gas and an outlet;
an ampoule configured to supply a precursor gas;
a momentum-based flow restriction member including an inlet and an outlet;
a valve system, in fluid communication with the first mass flow controller and the ampoule, configured to supply the precursor gas and the carrier gas to the momentum-based flow restriction member;
a pressure sensing system configured to sense an inlet pressure at the inlet of the momentum-based flow restriction member and an outlet pressure at the outlet of the momentum-based flow restriction member;
a controller configured to determine a flow rate of the precursor gas at the outlet of the momentum-based flow restriction member based on a pressure difference between the inlet pressure and the outlet pressure; and
a second mass flow controller including an inlet in communication with the inlet of the first mass flow controller and an outlet in communication with the outlet of the momentum-based flow restriction member,
wherein the controller is configured to adjust the flow rate of the precursor gas to the substrate processing chamber by controlling the flow rate of the carrier gas to the first mass flow controller and to vary the flow rate of the carrier gas supplied by the second mass flow controller to the substrate processing chamber in response to changes in the flow rate of the carrier gas to the first mass flow controller.

14. A method for supplying a precursor gas to a substrate processing chamber, comprising:
supplying a carrier gas using a first mass flow controller;
supplying the precursor gas using an ampoule;
supplying the precursor gas and the carrier gas to a momentum-based flow restriction member including an inlet and an outlet;
sensing an inlet pressure at the inlet of the momentum-based flow restriction member and an outlet pressure at the outlet of the momentum-based flow restriction member; and
based on a pressure difference between the inlet pressure and the outlet pressure and a predetermined relationship between the pressure difference and the flow rate of the precursor gas, determining a flow rate of the precursor gas to the substrate processing chamber while the momentum-based flow restriction member is receiving both the precursor gas and the carrier gas.

15. The method of claim 14, further comprising adjusting a flow rate of the carrier gas supplied by the first mass flow controller, based on the determined flow rate of the precursor gas, to control the flow rate of the precursor gas at the outlet of the momentum-based flow restriction member.

16. The method of claim 14, further comprising adjusting a temperature of the ampoule, based on the calculated flow rate of the precursor gas, to control the flow rate of the precursor gas at the outlet of the momentum-based flow restriction member.

17. The method of claim 14, wherein the momentum-based flow restriction member includes a restricted orifice.

18. The method of claim 14, wherein supplying the precursor gas and the carrier gas includes:
using a first valve selectively connecting the outlet of the first mass flow controller to the ampoule;
using a second valve selectively connecting the outlet of the first mass flow controller to the momentum-based flow restriction member; and
using a third valve selectively connecting the ampoule to the momentum-based flow restriction member.

19. The method of claim 14, wherein sensing the inlet pressure and the outlet pressure includes:
arranging a first pressure sensor in communication with the inlet of the momentum-based flow restriction member; and
arranging a second pressure sensor in communication with the outlet of the momentum-based flow restriction member.

20. The method of claim 14, wherein sensing the inlet pressure and the outlet pressure includes:
selectively connecting a pressure sensor to the inlet of the momentum-based flow restriction member and sensing the inlet pressure; and
selectively connecting the pressure sensor to the outlet of the momentum-based flow restriction member and sensing the outlet pressure.

21. The method of claim 14, wherein the carrier gas has a first density, the precursor gas has a second density, and the second density is greater than 9 times the first density.

22. The method of claim 14, wherein the carrier gas includes argon and the precursor gas is selected from a group consisting of tungsten pentachloride and tungsten hexachloride.

23. The method of claim 14, further comprising:
arranging an inlet of a second mass flow controller in communication with an inlet of the first mass flow controller and an outlet of the second mass flow controller in communication with an outlet of the momentum-based flow restriction member;
varying the flow rate of the precursor gas to the substrate processing chamber by adjusting the flow rate of the first mass flow controller; and
varying the flow rate of the carrier gas supplied by the second mass flow controller to the substrate processing chamber in response to changes to the flow rate of the first mass flow controller.

* * * * *